United States Patent
Rhee et al.

(10) Patent No.: US 8,828,751 B2
(45) Date of Patent: Sep. 9, 2014

(54) METHOD OF MANUFACTURING LIGHT EMITTING DEVICE

(71) Applicant: Samsung Electronics Co., Ltd., Suwon-si (KR)

(72) Inventors: Do Young Rhee, Seoul (KR); Tan Sakong, Seoul (KR); Ki Sung Kim, Gyeonggi-do (KR); Suk Ho Yoon, Seoul (KR); Young Sun Kim, Gyeonggi-do (KR); Sung Tae Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 54 days.

(21) Appl. No.: 13/844,569

(22) Filed: Mar. 15, 2013

(65) Prior Publication Data

US 2013/0244353 A1 Sep. 19, 2013

(30) Foreign Application Priority Data

Mar. 16, 2012 (KR) .................. 10-2012-0026988

(51) Int. Cl.
*H01L 21/00* (2006.01)
*H01L 33/00* (2010.01)
*H01L 33/26* (2010.01)

(52) U.S. Cl.
CPC .............. *H01L 33/005* (2013.01); *H01L 33/26* (2013.01)
USPC ................ 438/22; 438/761; 257/79

(58) Field of Classification Search
None
See application file for complete search history.

(56) References Cited

U.S. PATENT DOCUMENTS

| 2005/0082548 | A1* | 4/2005 | Sakong et al. .................. 257/79 |
| 2011/0186910 | A1 | 8/2011 | Forrest et al. |
| 2011/0198667 | A1* | 8/2011 | Lee et al. ...................... 257/103 |

FOREIGN PATENT DOCUMENTS

| KR | 10-2005-0037084 A | 4/2005 |
| KR | 10-2008-0022459 A | 3/2008 |
| KR | 10-2009-0065037 A | 6/2009 |

* cited by examiner

*Primary Examiner* — Andres Munoz
(74) *Attorney, Agent, or Firm* — McDermott Will & Emery LLP

(57) ABSTRACT

Provided a method of manufacturing a semiconductor light emitting device, the method includes forming a light emitting structure by growing a first conductivity type semiconductor layer, an active layer and a second conductivity type semiconductor layer on a substrate. The forming of the light emitting structure includes: forming a protective layer after a portion of the light emitting structure is formed forming a sacrificial layer on the protective layer; and continuously forming a further portion of the light emitting structure on the sacrificial layer.

19 Claims, 4 Drawing Sheets

METHOD OF MANUFACTURING LIGHT EMITTING DEVICE

CROSS-REFERENCE TO RELATED APPLICATIONS

This application claims the benefit of priority to Korean Patent Application No. 10-2012-0026988 filed on Mar. 16, 2012, in the Korean Intellectual Property Office, the entire contents of which are incorporated by reference.

TECHNICAL FIELD

The present disclosure relates to a method of manufacturing a light emitting device.

BACKGROUND

A light emitting diode (LED) is a semiconductor device that emits light of various colors based on electron-hole recombination which occurs at a p-n junction between p-type and n-type semiconductors when current is applied to the LED. Compared to a filament-based light emitting device, LED devices have several advantages such as increased longevity, lower power consumption, superior initial-operating characteristics, and high vibration resistance. These factors have continually increased demand for LEDs. Recently, much attention has been directed to group III nitride semiconductors which emit light in a blue/short wavelength region.

Nitride semiconductor crystals, which are part of light emitting devices that use group III nitride semiconductor, are grown on a sapphire or SiC substrate. In order to grow these semiconductor crystals, a plurality of gas-state sources are deposited on the substrate by a vapor deposition process. The light emission performance and reliability of a semiconductor light emitting device may be significantly affected by the quality of semiconductor layers (such as crystallinity). Therefore, the quality of semiconductor layers may depend on the structure, internal environment and usage conditions of a vapor deposition apparatus used for the growth of semiconductor thin films. Thus, a need exists for a method of improving the quality of semiconductor layers by improving and optimizing the vapor deposition process.

SUMMARY

An aspect of the present inventive concept provides a method of manufacturing a semiconductor light emitting device having a significantly reduced degradation in crystalline quality of semiconductor layers while being processed.

An aspect of the present inventive concept also provides a method of manufacturing a semiconductor light emitting device configured to optimize a semiconductor light emitting device manufacturing process and system and improving productivity.

According to an aspect of the present inventive concept, provided is a method of manufacturing a semiconductor light emitting device, the method comprising forming a light emitting structure by growing a first conductivity type semiconductor layer, an active layer and a second conductivity type semiconductor layer on a substrate, wherein the forming of the light emitting structure comprises steps of: (a), forming a protective layer after a portion of the light emitting structure is formed; (b), forming a sacrificial layer on the protective layer; and (c), continuously forming a further portion of the light emitting structure on the sacrificial layer, wherein the sacrificial layer is removed prior to or during the forming of the further portion of the light emitting structure in step (c).

The protective layer may have a compositional formula of $Al_xGa_{1-x}N$ (0<x<1).

The sacrificial layer may have a compositional formula of $Al_yIn_zGa_{1-y-z}N$ (0≤y<1 and 0<z≤1).

The sacrificial layer may have a compositional formula of $Al_yIn_zGa_{1-y-z}N$ (0≤y<1, 0<z≤1 and y<z).

The sacrificial layer may be spontaneously decomposed.

Steps (b) and (c) may be performed in different reaction chambers.

The method may further include a step of transferring the substrate from one reaction chamber to another reaction chamber between steps (b) and (c).

Steps (a) and (b) may be performed in the same reaction chamber.

Step (a) may include sequentially growing the first conductivity type semiconductor layer and the active layer.

Step (c) may include growing the second conductivity type semiconductor layer.

Step (a) may include growing the first conductivity type semiconductor layer of the light emitting structure.

Step (c) may include regrowing the first conductivity type semiconductor layer and sequentially growing the active layer and the second conductivity type semiconductor layer.

Step (c) may include sequentially growing the active layer and the second conductivity type semiconductor layer.

The sacrificial layer may be decomposed in step (c) under conditions of a growth temperature and a reactant gas for the further portion of the light emitting structure.

The protective layer may be removed in step (c) by maintaining an interior of a reaction chamber at a higher temperature than that of the further portion of the light emitting structure forming temperature prior to the forming of the further portion of the light emitting structure.

The forming of the light emitting structure may include repeating steps (a) through (c) two or more times.

According to another aspect of the present inventive concept, provided is a method of manufacturing a semiconductor light emitting device, the method comprising forming a light emitting structure by growing a first conductivity type semiconductor layer, an active layer and a second conductivity type semiconductor layer on a substrate, wherein the forming of the light emitting structure comprises steps of: (a) disposing, in a first reaction chamber, a protective layer after a portion of the light emitting structure is formed; (b) disposing a sacrificial layer on the protective layer, and then transferring the substrate from the first reaction chamber to a second reaction chamber; and (c) continuously disposing, in the second reaction chamber, a further portion of the light emitting structure on the sacrificial layer. The sacrificial layer may be removed prior to or during the disposing of the further portion of the light emitting structure in step (c). The protective layer may have compositional formula of $Al_xGa_{1-x}N$ (0<x<1). The sacrificial layer may be removed by applying an artificial agent.

BRIEF DESCRIPTION OF THE DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION OF THE EMBODIMENTS

Figure 1:
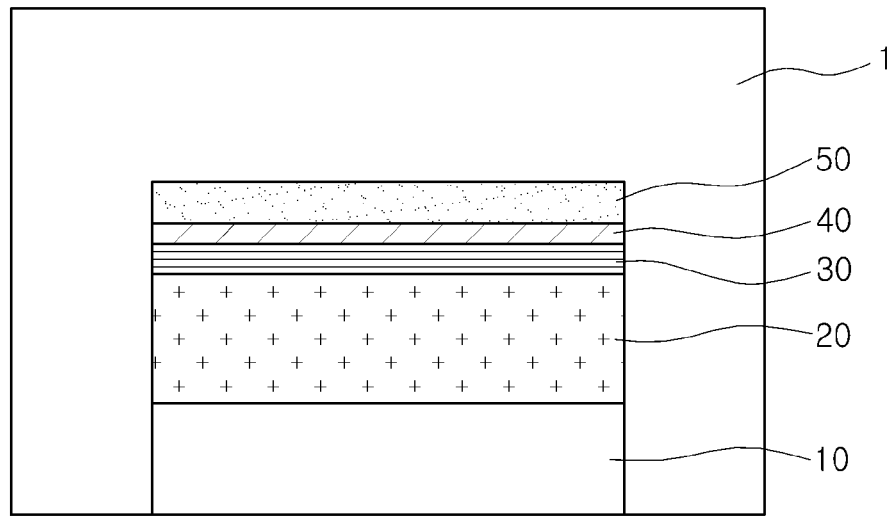
FIGS. 1 through 4 are cross sectional views schematically illustrating a method of manufacturing a semiconductor light emitting device according to an embodiment of the present inventive concept.

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

FIGS. 1 through 4 are views schematically illustrating a method of manufacturing a semiconductor light emitting device according to an embodiment of the present inventive concept.

The method of manufacturing a semiconductor light emitting device according to the present embodiment of the inventive concept may include forming or disposing a light emitting structure on a substrate 10. The light emitting structure includes a first conductivity type semiconductor layer 20, an active layer 30 and a second conductivity type semiconductor layer 60.

The forming of the light emitting structure includes a step (a) of, forming a protective layer 40 on a portion of the light emitting structure partially formed, a step (b) of forming a sacrificial layer 50 on the protective layer 40, and a step (c) of continuously forming a further portion of the light emitting structure on the sacrificial layer 50. In step (c) of continuously forming a further portion of the light emitting structure on the sacrificial layer, the sacrificial layer is removed prior to or during the forming of the further portion of the light emitting structure in step (c).

With reference to FIG. 1, in step (a), portions of the light emitting structure, namely, the first conductivity type semiconductor layer 20 and the active layer 30, may be grown on the substrate 10 in a first reaction chamber 1, and then in step (b), the protective layer 40 and the sacrificial layer 50 may be sequentially formed.

The growth of the portions of the light emitting structure may be performed by methods such as Metal Organic Chemical Vapor Deposition (MOCVD), Hydride Vapor Phase Epitaxy (HVPE), Molecular Beam Epitaxy (MBE), and Atomic Layer Deposition (ALD).

The substrate 10 is provided for the growth of semiconductor layers, and the substrate may be formed of sapphire, SiC, $MgAl_2O_4$, MgO, $LiAlO_2$, $LiGaO_2$, GaN, Si or the like. For example, a sapphire substrate may be formed of a crystal having Hexa-Rhombo R3c symmetry, and has a lattice constant of 13.001 Å in a C-axis and a lattice constant of 4.758 Å in an A-axis. Orientation planes of the sapphire substrate include a C (0001) plane, an A (1120) plane, and an R (1102) plane, for example. In particular, the C plane is mainly used as a substrate for nitride growth as it facilitates the growth of a nitride film and is stable at a high temperature. A buffer layer (not shown) may be provided as an undoped semiconductor layer formed of nitride or the like. The buffer layer upon which the semiconductor layers are to be grown thereon may alleviate lattice defects in the semiconductor layers.

The first conductivity type nitride semiconductor layer 20 may be formed and disposed on the substrate as an n-type semiconductor layer made of semiconductor materials having a compositional formula of $Al_xIn_yGa_{(1-x-y)}N$ (0≤x≤1, 0≤y≤1 and 0≤x+y≤1) or $Al_xIn_yGa_{(1-x-y)}P$ (0≤x≤1, 0≤y≤1 and 0≤x+y≤1). In the present embodiment of the inventive concept, the first and second conductivity type nitride semiconductor layers may refer to n-type and p-type semiconductor layers, respectively; however, the inventive concept is not limited thereto. For example, when the first conductivity type nitride semiconductor layer 20 has the compositional formula of $Al_xIn_yGa_{(1-x-y)}N$ (0≤x≤1, 0≤y≤1 and 0≤x+y≤1), GaN, AlGaN, InGaN or the like may be used.

The active layer 30 may be formed and disposed on the first conductivity type semiconductor layer 20. The active layer 30 may emit light having a predetermined level of energy through electron-hole recombination, and may have a multi-quantum-well (MQW) structure in which quantum well layers and quantum barrier layers are alternately stacked. In the case of the nitride semiconductor, an InGaN/GaN structure may be used. Alternatively, the MQW structure may be a multilayer structure of $Al_xIn_yGa_{(1-x-y)}P$ (0≤x≤1, 0≤y≤1 and 0≤x+y≤1) and employ an InGaP/GaP structure. In this case, the semiconductor may be used to emit red light in terms of bandgap energy characteristics, as compared with the nitride semiconductor.

In step (a), the protective layer 40, formed and disposed on the partially formed light emitting structure, may be formed and disposed on an upper surface of the active layer 30 of the light emitting structure according to the present embodiment. The protective layer 40 covers the upper surface of the active layer 30 such that it may protect the surface of the semiconductor layer from damage due to temperature and pressure changes during transfer from one reaction chamber to another reaction chamber. The protective layer 40 may be formed of a nitride semiconductor including aluminum (Al). Specifically, the protective layer 40 may have a compositional formula of $Al_xGa_{1-x}N$ (0<x<1). Since the surface of the protective layer 40 formed of $Al_xGa_{1-x}N$ (0<x<1) is not easily deformed by external environmental changes, it may effectively protect the active layer 30 formed under it.

Then, in step (b), the sacrificial layer 50 may be formed and disposed on the protective layer 40. In this operation, the sacrificial layer 50 prevents air exposure of the protective layer. For example, when formed within the first reaction chamber 1 and transferred to a second reaction chamber 2, the sacrificial layer 50 may prevent contamination and oxidation of the surface of the protective layer 40.

Examples of the sacrificial layer 50 may include nitride semiconductors including indium (In). For example, the sacrificial layer 50 may have a compositional formula of $Al_yIn_zGa_{1-y-z}N$ (0≤y<1 and 0<z≤1). In this example, the indium (In) content in the sacrificial layer 50 may be greater than of the content aluminum (Al). In addition, the sacrificial layer 50 may have a compositional formula of $Al_yIn_zGa_{1-y-z}N$ (0≤y<1, 0<z≤1 and y<z). Under certain conditions, the nitride semiconductors including indium (In) may be easily removed, and spontaneously decompose at a high temperature. For example, the sacrificial layer 50 may be spontaneously removed under conditions of subsequent semiconductor growth, that is, under conditions of high temperature or harsh reactant gas conditions. Thus, the sacrificial layer may not be included in the final device.

In the present embodiment, the sacrificial layer 50 is spontaneously removed in a subsequent process. However, the inventive concept is not limited to such a process. The sacrificial layer 50 may be artificially removed. As will be described in further detail below, after the substrate 10 is transferred to the second reaction chamber 2, the sacrificial layer 50 may be removed by applying an artificial agent, such as an etching gas, or a chemical solution to the sacrificial layer, without considering the conditions of subsequent semiconductor layer growth (source gas, temperature and the like). Meanwhile, the sacrificial layer 50 may be formed inside the first reaction chamber 1 using the same or a similar process as that of the first conductivity type semiconductor layer 20, except changing the type of reactant gas.

As will be described in further detail below, according to the present embodiment of the inventive concept, the light emitting structure, namely, the light emitting stack including the first conductivity type semiconductor layer 20, the active layer 30 and the second conductivity type semiconductor layer 60 is separately grown in different reaction chambers. During such a separate growth process, the semiconductor layer may be exposed to the air. In the case in which the semiconductor layer is exposed to air and the some region of semiconductor layer surface is contaminated, the contaminated region may serve as a current leakage path. Also, during transfer from one reaction chamber to another, the surface of the semiconductor layer may become defective due to rapid changes in temperature and pressure. In this manner, the performance of the device may be degraded. Therefore, in the formation of the light emitting structure according to the present embodiment, the protective layer 40 and the sacrificial layer 50 may be sequentially formed on a growth surface of the light emitting structure so as to prevent the growth surface of the light emitting structure from air exposure during transfer to another reaction chamber for the separate growth.

Figure 2:
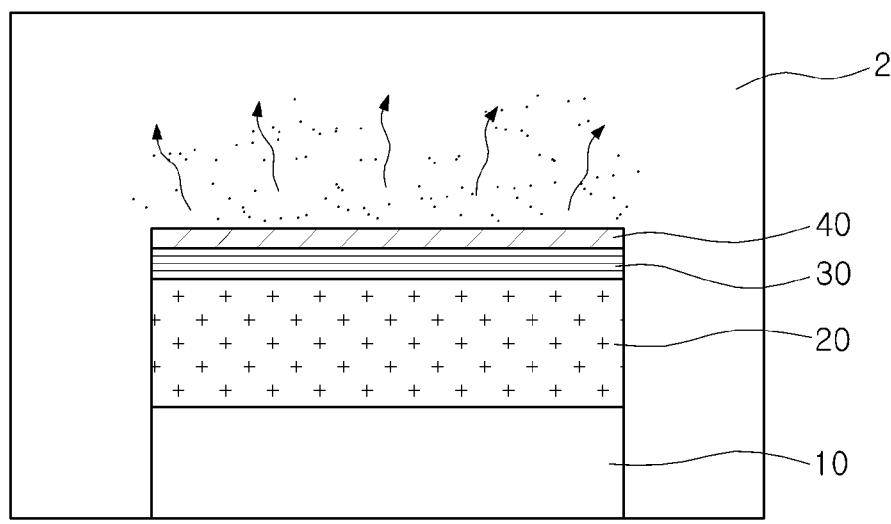

Next, as shown in FIG. 2, the substrate 10 having the protective layer 40 and the sacrificial layer 50 formed and disposed on the semiconductor layers is transferred to the second reaction chamber 2. Thereafter, the further portion of the light emitting structure, that is, the second conductivity type semiconductor layer 60 is continuously grown in step (c). At this time, the sacrificial layer 50 may be decomposed so as to be removed from the surface of the protective layer 40.

However, as described above, the sacrificial layer 50 may not be spontaneously decomposed in the growth of the further portion of the light emitting structure, i.e., in the growth of the second conductivity type semiconductor layer 60. In this case, a separate removal process may be performed to remove the sacrificial layer 50. In the present embodiment, the growth of the semiconductor layers forming the light emitting structure may be conducted using two or more reaction chambers. The advantages obtained using this process will be described in detail as follows.

First, the first conductivity type semiconductor layer 20, the active layer 30 and the second conductivity type semiconductor layer 60 have different growth conditions such as temperature, source gas atmosphere, and dopants, and they are grown in different chambers satisfying respective growth conditions. Thus, the quality of the light emitting device may be improved and equipment management and operational capability may be facilitated by using two or more reaction chambers.

For example, different types of dopants may be injected to form the first and second conductivity type semiconductor layers 20 and 60. In the case in which the light emitting structure is continuously formed in a single reaction chamber, a second conductivity type dopant (for example, Mg) used for one layer may remain in the reaction chamber during formation of a different layer, and such an undesired may be introduced during the growth. In this case, light may not be emitted from a region affected by the introduced dopant, and the quality of the light emitting device may be deteriorated.

According to the present embodiment, such problems may be solved by separately growing different layers of the light emitting structure inside different reaction chambers by transferring the light emitting structure to different reaction chambers configured to have the particular growth conditions for individual semiconductor layers. Also, the respective reaction chambers may be continuously used in a state in which temperature, pressure and gas atmosphere suitable for certain semiconductor layer growth are maintained. As such, the reaction chambers do not have to be continuously adjusted and this results in improved management and operational capabilities of the reaction chambers.

Further, the separate growth method as described above may result in reduced processing costs and time consumption due to an decrease in the occurrence of defects. In contrast, when first and second conductivity type semiconductor layers 20 and 60 and the active layer 30 are simultaneously grown in the individual first and second reaction chambers 1 and 2, the individual first and second reaction chambers 1 and 2 are operated for a relatively long period of time, and the amount of source gas and processing time consumed is high. This is due, to the higher occurrence of defects compared with the separate growth of the semiconductor layers described in the present embodiment.

In addition, since an initial growth process is completed using a single deposition apparatus within a relatively short period of time, the repair and maintenance of the deposition apparatus prior to a sequential growth process may be flexibly implemented. In this case, the first and second reaction chambers 1 and 2 may employ the same deposition process, but may be different deposition apparatuses. That is, both of the first and second reaction chambers 1 and 2 may be MOCVD apparatuses, or the first reaction chamber 1 may be an HVPE apparatus and the second reaction chamber 2 may be an MOCVD apparatus. In addition, even when the first and second reaction chambers 1 and 2 are both MOCVD apparatuses, the structures of each reaction chamber may be different. For example, the first reaction chamber 1 may have a structure configured so that a reactant gas is injected in a vertical direction with respect to a susceptor, while the second reaction chamber 2 may have a structure configured to inject a reactant gas in a direction parallel to a susceptor.

The protective layer 40 formed and disposed on the light emitting structure partially formed inside the first reaction chamber 1 may prevent surface damage due to a temperature change during transfer to the second reaction chamber, surface deterioration due to pressure change, and dopant introduction or release.

The sacrificial layer 50 formed and disposed on the protective layer 40 may prevent contamination and oxidization of the light emitting structure when the light emitting structure is transferred from the first reaction chamber 1 to the second reaction chamber 2. The sacrificial layer 50 may be removed in step (c) in which the light emitting structure is continuously grown after being transferred to the second reaction chamber 2. In this manner, a growth interface having improved surface quality may be provided.

The sacrificial layer 50 may be decomposed while the active layer 30 is grown in the second reaction chamber 2. Specifically, the sacrificial layer 50 may be decomposed by the reactant gas contained in the second reaction chamber 2, such as $NH_3$ or $H_2$, under a relative high temperature. In this case, when the second conductivity type semiconductor layer 60 is grown at a relatively low temperature, the sacrificial layer 50 may not be spontaneously removed. Accordingly, the interior of the second reaction chamber 2 is maintained at a high temperature prior to the growth of the second conductivity type semiconductor layer 60. In this manner, all or substantially all of the sacrificial layer 50 may be removed, and then the second conductivity type semiconductor layer may be grown.

Figure 3:
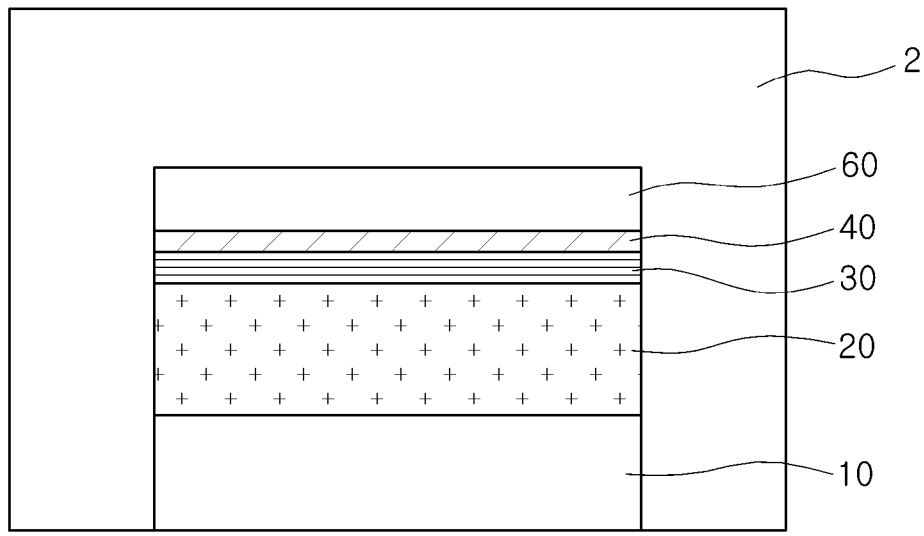

FIG. 3 shows the complete light emitting structure formed by removing the sacrificial layer 50 and growing the second conductivity type semiconductor layer 60 on the exposed protective layer 40. In the present embodiment, the second conductivity type semiconductor layer 60 is grown after the removal of the sacrificial layer 50. However, the removal of the sacrificial layer 50 and the growth of the second conductivity type semiconductor layer 60 may be performed simultaneously.

The second conductivity type semiconductor layer 60 may be formed of a p-type semiconductor, for example, $Al_xIn_yGa_{(1-x-y)}N$ ($0 \leq x \leq 1$, $0 \leq y \leq 1$ and $0 \leq x+y \leq 1$) or $Al_xIn_yGa_{(1-x-y)}P$ ($0 \leq x \leq 1$, $0 \leq y \leq 1$ and $0 \leq x+y \leq 1$), doped with Mg or the like.

Figure 4:
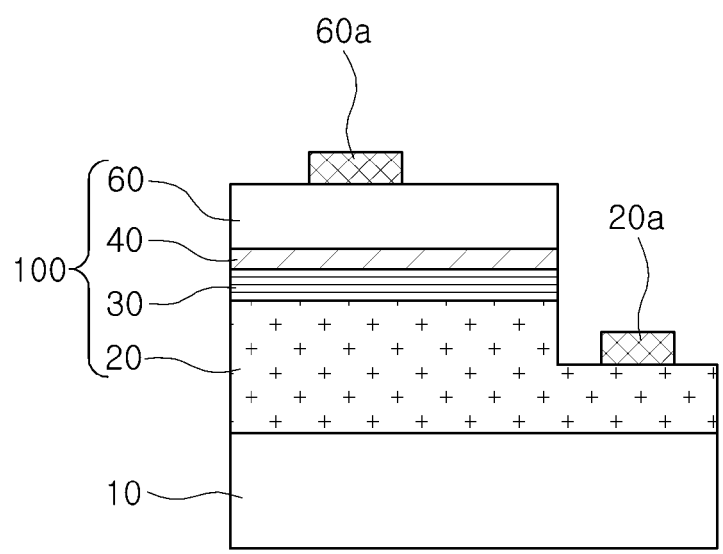

Then, as shown in FIG. 4, after the light emitting structure 100 is completely grown by forming the second conductivity type semiconductor layer 60, the first and second electrodes 20a and 60a may be electrically connected to the first and second conductivity type semiconductor layers 20 and 60, respectively.

The first electrode 20a may be formed and disposed on the first conductivity type semiconductor layer 20 exposed by etching portions of the second conductivity type semiconductor layer 60, the protective layer 40, the active layer 30 and the first conductivity type semiconductor layer 20. The second electrode 60a may be formed and disposed on the second conductivity type semiconductor layer 60. The first and second electrodes 20a and 60a in FIG. 4 may be oriented in the same direction. However, each electrode may have varied the positions and connection structures thereof may be varied if necessary.

FIGS. 5 through 8 are cross sectional views schematically illustrating a method of manufacturing a semiconductor light emitting device according to another embodiment of the present inventive concept.

In the present embodiment, a first conductivity type semiconductor layer 21 may be partially formed in a first reaction chamber 1', and a protective layer 41 and a sacrificial layer 51 are formed and disposed on an upper surface of the first conductivity type semiconductor layer 21. A substrate 11 having the protective layer 41 and the sacrificial layer 51 formed and disposed on the protective layer 41 may be transferred to a second reaction chamber 2' and be subjected to a subsequent growth process.

The first conductivity type semiconductor layer 21, an active layer 31 and a second conductivity type semiconductor layer 61 comprising the light emitting structure in the present embodiment can be similarly understood from the description of similar components as those described in the embodiment of FIGS. 1 through 4, and only different features will be described below.

Figure 5:
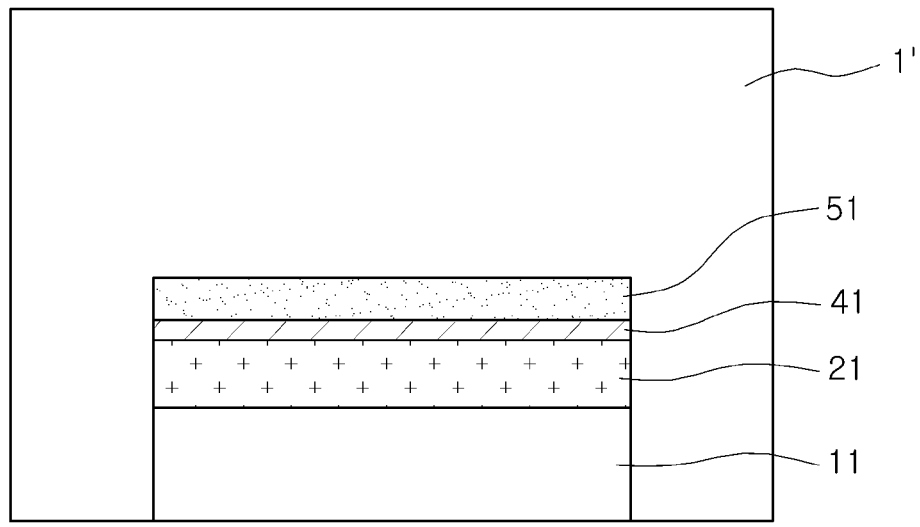
FIGS. 5 through 8 are cross sectional views schematically illustrating a method of manufacturing a semiconductor light emitting device according to another embodiment.

With reference to FIG. 5, the first conductivity type semiconductor layer 21 is formed and disposed on the substrate 11 and then the protective layer 41 and the sacrificial layer 51 are formed and disposed thereon in operation (a'). This process may be performed inside the first reaction chamber 1'.

Figure 6:
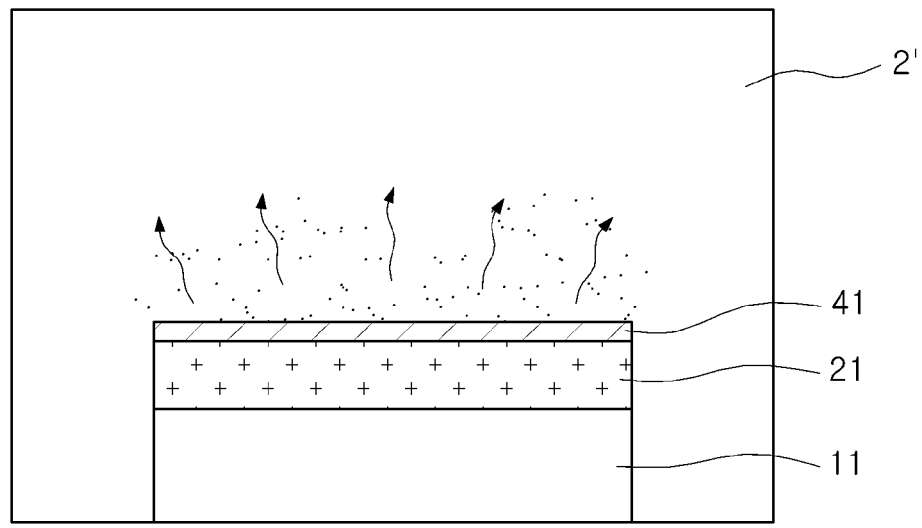
Figure 7:
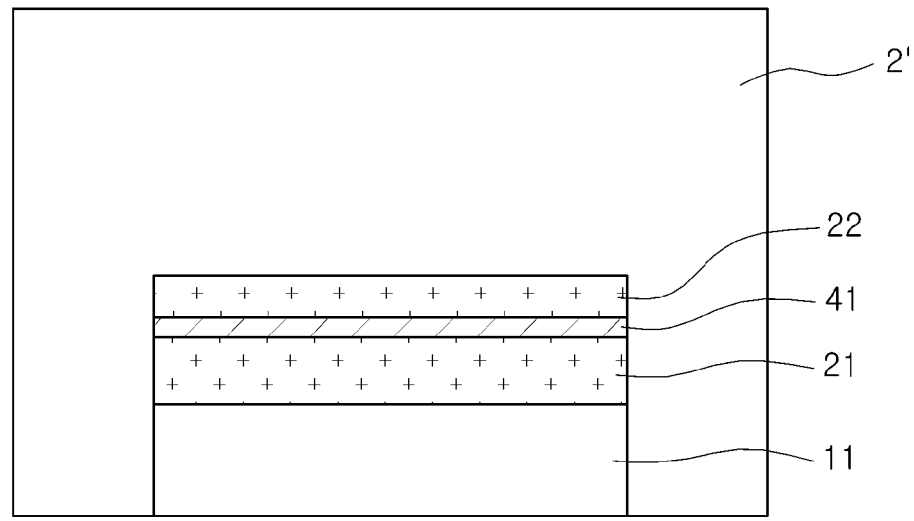

Next, as shown in FIGS. 6 and 7, the substrate 11 having the sacrificial layer 51 formed and disposed on the substrate surface is transferred to the second reaction chamber 2'. Subsequently, a first conductivity type semiconductor layer 22 is continuously grown in step (c'). As described in the previous embodiment, the sacrificial layer 51 may be removed prior to or during the regrowth of the first conductivity type semiconductor layer 22 in operation (3').

In the present embodiment, the first conductivity type semiconductor layer 21 grown in the first reaction chamber 1' and the first conductivity type semiconductor layer 22 grown in the second reaction chamber 2' have different growth conditions (i.e. growth temperature, and reactant gas). For example, an n-type GaN layer may be grown in the first reaction chamber 1' and an n-type superlattice layer may be grown in the second reaction chamber 2'.

Thereafter, the active layer 31 and the second conductivity type semiconductor layer 61 are sequentially formed and disposed on the first conductivity type semiconductor layer 22. In this manner, the light emitting structure is formed. In the present embodiment, the active layer 31, a protective layer 42, and a sacrificial layer 52 may be repeatedly formed on the first conductivity type semiconductor layer 22 in the second reaction chamber 2'. The process described in FIGS. 1 through 3 may be repeated.

Specifically, the substrate having the first conductivity type semiconductor layer 21, the protective layer 41, the regrown first conductivity type semiconductor layer 22, the active layer 31, the protective layer 42 and the sacrificial layer 52 sequentially formed and disposed on each of the upper surfaces t is transferred to a third reaction chamber (not shown), and then the second conductivity type semiconductor layer 61 is grown in the third reaction chamber. In this manner, a complete a light emitting structure 101 is formed. That is, the forming of the protective layers 41 and 42 and the sacrificial layers 51 and 52 may be repeated two or more times if necessary. For example, the growth of the active layer 31 and the second conductivity type semiconductor layer 61 may be continuously performed within the second reaction chamber 2' or may be transferred to a separate third or fourth reaction chamber (not shown) and separately performed.

Alternatively, the protective layer 41 and the sacrificial layer 51 may be sequentially stacked on the first conductivity type semiconductor layer 21 in the first reaction chamber 1'. The stack may then be transferred to the second reaction chamber 2' and the active layer 31 may be grown on the stack. For example, in the case in which the first conductivity type semiconductor layer is comprises an n-type GaN, it may be grown at approximately 1100° C. to 1300° C., and the interior of the first reaction chamber is correspondingly maintained within the same temperature range. The active layer 31 and the second conductivity type semiconductor layer may be grown at a relatively low growth temperature of approximately 700° C. to 1100° C., and the interior of the second reaction chamber is also correspondingly maintained within the same temperature range.

In this case, it is not necessary to rapidly change the temperature in the interior of the first or second reaction chamber 1' or 2' so as to grow the active layer 31 and the second conductivity type semiconductor layer 61 after the growth of the first conductivity type semiconductor layer 21. Therefore, as the temperature in the first and second reaction chambers 1' and 2' is maintained at a predetermined level, equipment management may be facilitated and device deterioration may be reduced.

Figure 8:
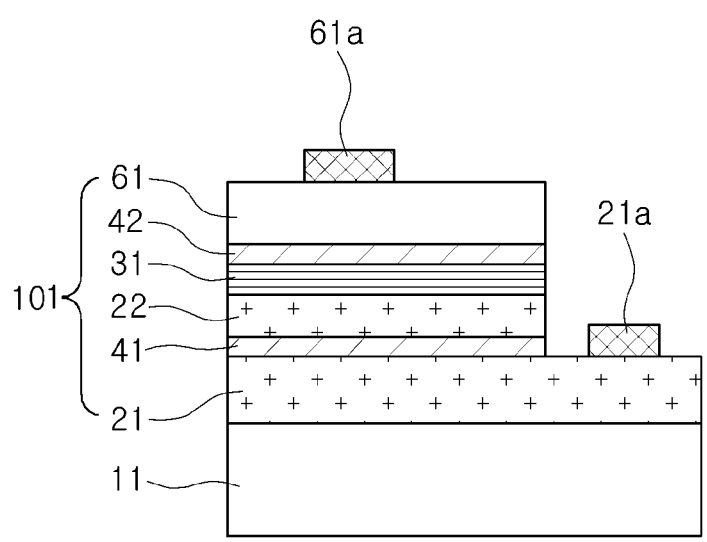

Next, as shown in FIG. 8, after the growth of the second conductivity type semiconductor layer 61 is completed, the first and second electrodes 21a and 61a may be formed to be electrically connected to the first and second conductivity type semiconductor layers 21 and 61, respectively. As described above, the structure of the first and second electrodes 21a and 61a shown in FIG. 8 is an example. However, the electrodes may be formed on various positions of the light emitting structure 101 having the first conductivity type semiconductor layers 21 and 22, the active layer 31, and the second conductivity type semiconductor layer 61. For example, the first electrode 21a may be formed and disposed on a surface of the first conductivity type semiconductor layer 21 exposed by the removal of the substrate 101 or various electrical connection structures may be employed by using a conductive via or the like.

As set forth above, in a method of manufacturing a semiconductor light emitting device according to embodiments of the inventive concept, damage to crystalline quality of semiconductor layers while being processed can be significantly reduced.

Furthermore, in a method of manufacturing a semiconductor light emitting device according to embodiments of the inventive concept, a semiconductor light emitting device manufacturing process and system can be optimized and productivity can be improved.

Although a few exemplary embodiments of the present inventive concept have been shown and described, the present inventive concept is not limited to the described exemplary embodiments. Instead, it would be appreciated by those skilled in the art that changes may be made to these exemplary embodiments without departing from the principles and spirit of the inventive concept, the scope of which is defined by the appended claims and their equivalents

What is claimed is:

1. A method of manufacturing a semiconductor light emitting device, the method comprising forming a light emitting structure by growing a first conductivity type semiconductor layer, an active layer and a second conductivity type semiconductor layer on a substrate,
    wherein the forming of the light emitting structure comprises steps of:
    (a) forming a protective layer after a portion of the light emitting structure is formed;
    (b) forming a sacrificial layer on the protective layer; and
    (c) continuously forming a further portion of the light emitting structure on the sacrificial layer,
    wherein the sacrificial layer is entirely removed prior to or during the forming of the further portion of the light emitting structure in step (c).

2. The method of claim 1, wherein the protective layer has a compositional formula of $Al_xGa_{1-x}N$ (0<x<1).

3. The method of claim 1, wherein the sacrificial layer has a compositional formula of $Al_yIn_zGa_{1-y-z}N$ (0≤y<1 and 0<z≤1).

4. The method of claim 3, wherein the sacrificial layer has a compositional formula of $Al_yIn_zGa_{1-y-z}N$ (0≤y<1, 0<z≤1 and y<z).

5. The method of claim 1, wherein the sacrificial layer is spontaneously decomposed.

6. The method of claim 1, wherein steps (b) and (c) are performed in different reaction chambers.

7. The method of claim 1, further comprising transferring the substrate from one reaction chamber to another reaction chamber between steps (b) and (c).

8. The method of claim 1, wherein steps (a) and (b) are performed in the same reaction chamber.

9. The method of claim 1, wherein step (a) includes sequentially growing the first conductivity type semiconductor layer and the active layer.

10. The method of claim 9, wherein step (c) includes growing the second conductivity type semiconductor layer.

11. The method of claim 1, wherein step (a) includes growing the first conductivity type semiconductor layer of the light emitting structure.

12. The method of claim 11, wherein step (c) includes regrowing the first conductivity type semiconductor layer and sequentially growing the active layer and the second conductivity type semiconductor layer.

13. The method of claim 11, wherein step (c) includes sequentially growing the active layer and the second conductivity type semiconductor layer.

14. The method of claim 1, wherein the sacrificial layer is decomposed in step (c) under conditions of a growth temperature and a reactant gas for the further portion of the light emitting structure.

15. The method of claim 1, wherein the protective layer is removed in step (c) by maintaining an interior of a reaction chamber at a higher temperature than that of the further portion of the light emitting structure forming temperature prior to the forming of the further portion of the light emitting structure.

16. The method of claim 1, wherein the forming of the light emitting structure includes repeating steps (a) through (c) two or more times.

17. A method of manufacturing a semiconductor light emitting device, the method comprising forming a light emitting structure by growing a first conductivity type semiconductor layer, an active layer and a second conductivity type semiconductor layer on a substrate,
    wherein the forming of the light emitting structure comprises steps of:
    (a) disposing, in a first reaction chamber, a protective layer after a portion of the light emitting structure is formed;
    (b) disposing a sacrificial layer on the protective layer, and then transferring the substrate from the first reaction chamber to a second reaction chamber; and
    (c) continuously disposing, in the second reaction chamber, a further portion of the light emitting structure on the sacrificial layer wherein the sacrificial layer is entirely removed prior to or during the disposing of the further portion of the light emitting structure in step (c).

18. The method of claim 17, wherein the protective layer has a compositional formula of $Al_xGa_{1-x}N$ (0<x<1).

19. The method of claim 17, wherein the sacrificial layer is removed by applying an artificial agent.

* * * * *